United States Patent Office 3,236,708

Patented Feb. 22, 1966

3,236,708

ETCHING OF METALS

William J. Tillis, Levittown, N.J., assignor to FMC Corporation, New York, N.Y., a corporation of Delaware No Drawing. Filed Apr. 24, 1963, Ser. No. 275,241
12 Claims. (Cl. 156—11)

This invention relates to the etching of copper bearing a gold or other noble metal resist, and more particularly to the etching of copper bearing such a resist by a method which reduces undercutting of the copper relief provided thereby.

Methods have been developed for selectively dissolving or etching copper in the production of electrical printed circuits, printing plates or other products having predetermined raised portions, or reliefs, of copper metal. In the production of printed circuits, for example, copper foil is laminated to a plastic sheet or to a fiber sheet impregnated with a bonding material such as a phenolic resin and is masked with a resist material in areas which later become the circuit, and the masked copper sheet is subjected to attack by an etchant, preferably an aqueous peroxydisulfate solution. The resist material, frequently an ink, a wax or a photographic emulsion, is not attacked by the etchant, and accordingly the copper is dissolved preferentially in areas not coated by the resist. This produces a copper relief having the design of the electrical circuit, from which the resist may be removed if desired.

Gold and other noble metals have come into use as resist materials in these selective etching processes. The noble metal, normally gold, is plated onto the copper in the areas it is desired not to etch, and upon etching of the copper with a peroxydisulfate the noble metal remains on the surface of the relief; it serves not only as a resist during etching, but also to increase the corrosion resistance of the finished etched product.

The use of a noble metal plate or other noble metal deposit as a resist, however, has led to a severe problem. During etching of copper bearing a noble metal resist, the copper is undercut severely beneath the noble metal. That is, the copper is etched away laterally, thereby reducing the width of the copper relief produced to much less than the width of the resist pattern. This leads to obvious difficulties in use of an etched printed circuit, which by reason of the undercutting does not have the dimensions desired. This problem is much more severe when a noble metal resist is employed than when previous resists such as inks, waxes, photographic emulsions and the like are used. A means commonly used in attempting to overcome the problems created by undercutting has been to provide a resist pattern substantially wider than that desired in the relief following etching. This causes obvious problems, such as difficulty in controlling relief width, and uses more noble metal plate and etchant than would be necessary if the etch were more effectively vertical.

Another common method employed heretofore for reducing undercutting in etching operations, particularly for producing printing plates, has been to carry out the etch in successive steps, between steps fusing a resin onto the edge of the metal being etched so that the etchant will not attack this edge and cause it to be cut in laterally under the resist material. One very commonly used material is "dragon's blood" resin. This method has been effective in reducing undercutting, however, it is a complicated process and adds materially to the cost of etching.

It, therefore, has been desired to provide a process for reducing the undercutting of copper during etching when a resist of gold or other noble metal is present on the copper.

It has also been desired to provide such a process not requiring oversizing of the resist pattern or use of complex resin-coating operations employing multiple steps during etching to produce the desired result.

It has now been found, quite surprisingly, that by providing a thin layer of tin or of a tin-lead or tin-nickel alloy containing at least about 25% of tin on the surface of a gold or other noble metal resist on copper which is to be etched, and contacting the resulting workpiece with an aqueous etching solution containing from about 5% to its solubility limit of a peroxydisulfate of ammonium, sodium, lithium, barium, strontium, or potassium, at a temperature of about 50° to 150° F. until the copper has been etched in areas free of the resist to the desired extent, an etched copper product having only a minimal undercut is produced.

This simple process of providing the tin or tin alloy deposit on the noble metal resist surface results in a marked decrease in the extent of undercutting of the copper beneath the noble metal. This is quite surprising when it is realized that tin is not attacked by the peroxydisulfate. Thus, the etch factor, a measure of the degree of vertical versus lateral removal of copper, is increased from about 0.8 to about 3 in a typical case in which a copper foil .0028 inch thick and carried on a phenol formaldehyde resin-bonded fiber sheet is etched. Furthermore, this improvement in etch factor is achieved without modifying the etching procedure, other than by providing the coating of tin or tin alloy on the resist, and where desired removing it after etching. It does not involve oversizing the resist pattern, multiple etching steps or other complex operations.

Typical copper etching operations are conducted on copper foil .0015 to .0050 inch in thickness, carried on a backing material such as a resin-bonded fiber sheet or other backing material.

Other forms of copper may be etched by the present process, as for example sheets or blocks of the metal in preparation of printing plates, decorative items and the like.

The noble metal resist is applied to the copper in desired areas by any of several known processes, for example by first coating the surface of the copper in areas to be free of the noble metal (the area to be etched away eventually) with a plating masking material which will not hold a noble metal plate, and then plating the metal onto the surface from a typical plating solution. Alternatively, the noble metal may be preformed into the desired pattern and adhered to the copper surface, and resists provided in this or other alternate fashions are to be considered the equivalent, for purposes of this process, of a plate. The noble metal normally is employed in a thickness of about .00005 inch to .0004 inch, although thicker or thinner noble metal resists may be employed. The preferred noble metal for use herein is gold. Other useful noble metals include silver, platinum, rhodium and the like.

The tin or tin alloy plating deposited on the noble metal resist in accordance with this invention comprises either tin itself or a tin alloy containing at least about 25% of tin. A typical useful alloy is a solder composed of about 60% tin and 40% of lead. Other useful tin alloys may be formed with nickel. Small amounts of other metals may be included in the tin-lead and tin-nickel alloys. Such other metals should be selected, however, to avoid those which will decompose the peroxydisulfate excessively.

These tin or tin-containing deposits preferably are applied in a thickness of about .0000001 to .05 inch from typical chemical or electrical plating baths or by dipping the workpiece into a bath of molten tin or tin alloy. A typical tin electroplating bath is an aqueous solution containing stannous fluoborate ($Sn(BF_4)_2$) in the amount of about 200 g. per liter, fluoboric acid in the amount of about 100 g. per liter, boric acid in the amount of about 25 g. per liter, gelatin in the amount of about 6 g. per liter and about 1 g. per liter of β-naphthol. This solution has a pH of about 0.2 or less and a specific gravity of about 21 to 23° Bé., and is used at a temperature of about 70 to 120° F. The cathode current density used in plating (in the absence of agitation) has a limiting value at 70° F. of about 250 amperes per square foot, and at 100° F. of about 425 amperes per square foot. The current density is about 25 to about 125 amperes per square foot, and the average tank voltage is about 1 to 3 volts. When mechanical agitation is employed, higher current densities may be used. The anodes employed normally are pure cast tin, and the anode to cathode area ratio is about 2 to 1.

In producing a tin-lead plate, for example a 60% tin-40% lead solder plate, the aqueous plating solution contains a total of about 60 g. of tin per liter, about 55 g. of this being stannnous tin, along with about 25 g. of lead per liter, 100 g. of free fluoboric acid per liter, 25 g. of boric acid per liter, and about 5 g. of peptone per liter. The anodes employed with this solution are composed of 60% tin and 40% lead. In this case a cathode current density of about 30 amperes per square foot, and a temperature of about 60° to 100° F., are employed in plating, and the solution is agitated mechanically. The anode to cathode area ratio again is about 2 to 1. Tin-nickel plates are produced by known means.

The aqueous etching solution employed to etch the copper bearing the tin- or tin alloy-covered noble metal resist contains from about 5% to its solubility limit, and preferably about 5 to 25%, of an ammonium, sodium, potassium, barium, lithium or strontium peroxydisulfate. The preferred peroxydisulfate for use in the herein process is ammonium peroxydisulfate. In order to speed the rate of etching, about 5 parts per million of mercuric chloride or other mercuric salts may be added to the solution as a dissolution catalyst. These solutions are well known in the art; for example, the use of ammonium or other peroxydisulfate solutions catalyzed with mercuric chloride or other catalysts for copper dissolution is described fully in U.S. Patent 2,978,301.

The effect of the protective tin or tin alloy film during etching is described in terms of the etch factor. This is the ratio of the depth of the etch to one-half the maximum loss in width of copper metal in the relief beneath the resist. This affords a measure of the amount of attack by the etchant laterally compared to the amount of attack downwardly.

Where desired, the tin or tin alloy coating on the noble metal may be removed readily by known means, for example by contacting it with an aqueous solution containing about 20% of hydrochloric acid. Another means is by anodic dissolution of the tin or tin alloy in an aqueous solution containing 10% of sodium hydroxide. However, in some cases it is desirable to leave the tin coating on the noble metal.

The following examples are provided by way of illustration of the present invention only, and are not to be deemed as limiting the scope of conditions or ingredients effective in the present process.

*Example 1*

Copper foils measuring .0028 inch in thickness were bonded to phenol formaldehyde-containing fiber backing sheets, .0625 inch thick, and gold platings .00015 inch thick were deposited onto the copper foil surfaces in areas representing a desired electrical circuit, employing wax as a masking agent in areas not to be gold plated. Various thicknesses of tin, tin-lead and tin-nickel plates were deposited onto surfaces of the gold plates. The thicknesses and compositions of these plates are given in Table 1 appearing below.

The circuits were then treated to remove the wax masking agent from the copper foil in areas outside the desired circuit, and etched in aqueous solutions containing 25% of ammonium peroxydisulfate, 5 p.p.m. of mercuric chloride and 1 ounce of dissolved copper per gallon. The etches were carried out at a temperature of 100° F. The specimens were etched in a spray etcher having an 8 gallon capacity; a uniform spray distribution was provided by utilizing 8 spray nozzles which oscillate 15° in each direction from the horizontal.

Following etching, the specimens were encapsulated in bakelite; the encapsulated circuits were then sawed through to provide a cross-sectional edge, this edge was ground and polished, and undercutting was directly measured at 240× magnification using a micrometer scale inserted in the eye piece of a metallurgical microscope. The results are shown in Table 1.

TABLE 1.—ETCHING CHARACTERISTICS OF TIN- AND TIN-LEAD SOLDER PLATED COPPER PRINTED CIRCUITS

| Type of Resist | Type of Protective Plating | Thickness of Protective Plate (Inches) | Etch Time (Seconds) | Etch Factor |
|---|---|---|---|---|
| Gold Plate | None | none | 270 | 1.0 |
| Do | do | none | 290 | 0.8 |
| Kodak Photo Resist | do | none | 210 | 1.6 |
| Gold Plate | Tin Plate | .000001 | 300 | 3.3 |
| Do | do | .000005 | 330 | 8.2 |
| Do | do | .000003 | 345 | 5.6 |
| Do | 60–40 Tin-Lead (Solder). | .000002 | 210 | 1.8 |
| Do | do | .00036 | 200 | 1.4 |
| Do | do | .00072 | 210 | 2.1 |
| Do | 65–35 Tin-Nickel | .00004 | 290 | 1.3 |
| Do | do | .00009 | 280 | 1.4 |
| Do | do | .00022 | 310 | 1.4 |
| Do | do | .00043 | 300 | 1.5 |
| Do | do | .00065 | 350 | 1.4 |
| Do | do | .0013 | 320 | 1.6 |
| Do | do | .0026 | 325 | 1.9 |

*Example 2*

Use of aqueous solutions containing 20% of sodium peroxydisulfate, barium peroxydisulfate, strontium peroxydisulfate and lithium peroxydisulfate respectively, in the process of Example 1 in place of the ammonium peroxydisulfate solution used therein as an etchant, provides etching rates and degrees of undercutting closely comparable to those shown in Example 1.

Use of an aqueous potassium peroxydisulfate solution containing about 5% of that material results in an etching rate about one-fourth as fast as the rates shown in Example 1 and in a slightly lower etch factor. The etch factors using the tin and tin alloy coatings on the gold resist are improved over those achieved where the gold is not so coated, however, when the potassium peroxydisulfate etching system is used.

It will be apparent from the above data that the degree of undercutting produced in the peroxydisulfate etching of copper bearing a gold resist is reduced markedly when the gold is coated with tin or a tin alloy. This makes it possible to produce copper reliefs having substantially the same widths as the resist patterns employed in etching. This reduction of undercutting, and the consequent freedom from the need to provide oversized resist patterns to compensate for a large reduction in relief width, makes possible the etching of microcircuits and other items where relief widths are extremely small, in some cases on the order of only .002 inch to .005 inch.

The same process can be employed for manufacturing gold-plated circuits which have been provided by plating onto the original copper foil, in order, copper, nickel and gold. This procedure is often used to provide good electrical contact surfaces where surfaces are rubbed together repeatedly, such as in plug-in boards on computers, railway switches and the like.

Pursuant to the requirements of the patent statutes, the principle of this invention has been explained and exemplified in a manner so that it can be readily practiced by those skilled in the art, such exemplification including what is considered to represent the best embodiment of the invention. However, it should be clearly understood that, within the scope of the appended claims, the invention may be practiced by those skilled in the art, and having the benefit of this disclosure, otherwise than as specifically described and exemplified herein.

I claim:

1. Method of etching copper bearing a noble metal resist with an aqueous peroxydisulfate solution without providing excessive undercutting of the copper relief produced thereby, comprising providing a noble metal resist pattern on the surface of a metallic copper object, providing on said resist pattern a coating from the group consisting of tin coatings and coatings composed of a tin alloy from the group consisting of tin-lead and tin-nickel alloys containing at least 25% of tin, contacting the resulting workpiece with an aqueous solution containing from 5% to its solubility limit of a peroxydisulfate from the group consisting of the ammonium, sodium, lithium, barium, strontium and potassium peroxydisulfates at a temperature of 50° to 150° F. until the copper in areas free of said relief pattern has been etched and removing the resulting etched workpiece from said aqueous solution.

2. Method of claim 1 in which the noble metal resist is gold.

3. Method of claim 2 in which ammonium peroxydisulfate is employed as the peroxydisulfate.

4. Method of claim 2 in which sodium peroxydisulfate is employed as the peroxydisulfate.

5. Method of claim 2 in which lithium peroxydisulfate is employed as the peroxydisulfate.

6. Method of claim 2 in which barium peroxydisulfate is employed as the peroxydisulfate.

7. Method of claim 2 in which strontium peroxydisulfate is employed as the peroxydisulfate.

8. Method of claim 2 in which potassium peroxydisulfate is employed as the peroxydisulfate.

9. Method of claim 2 in which the aqueous peroxydisulfate solution contains mercuric ions as a catalyst for copper etching.

10. Method of claim 2 in which the coating on the gold resist pattern is a tin coating.

11. Method of claim 2 in which the coating on the gold resist pattern is a tin-lead alloy containing at least 25% of tin.

12. Method of claim 2 in which the coating on the gold resist pattern is a tin-nickel alloy containing at least 25% of tin.

References Cited by the Examiner

UNITED STATES PATENTS

| | | | |
|---|---|---|---|
| 2,731,333 | 1/1956 | Ko et al. | 156—3 |
| 3,137,600 | 6/1964 | Margulies et al. | 156—8 |

OTHER REFERENCES

Saubestre—Chemical Problems in Printed Wiring Industrial and Engineering Chemistry, vol. 51, No. 3, pp. 281–285.

ALEXANDER WYMAN, *Primary Examiner.*